United States Patent [19]

Ikeda

[11] Patent Number: 5,544,115
[45] Date of Patent: Aug. 6, 1996

[54] SEMICONDUCTOR MEMORY DEVICE ALLOWING SELECTION OF THE NUMBER OF SENSE AMPLIFIERS TO BE ACTIVATED SIMULTANEOUSLY

[75] Inventor: Yutaka Ikeda, Hyogo-ken, Japan

[73] Assignee: Mitsubishi Denki Kabushiki Kaisha, Tokyo, Japan

[21] Appl. No.: 390,261

[22] Filed: Feb. 15, 1995

Related U.S. Application Data

[63] Continuation of Ser. No. 903,400, Jun. 24, 1992, abandoned.

[30] Foreign Application Priority Data

Jan. 24, 1992 [JP] Japan .................................. 4-010924

[51] Int. Cl.⁶ ...................................................... G11C 7/00
[52] U.S. Cl. ............................ 365/207; 365/194; 365/233
[58] Field of Search ................................ 365/233.5, 233, 365/194, 208, 207, 230.06

[56] References Cited

U.S. PATENT DOCUMENTS

| | | | |
|---|---|---|---|
| 4,996,671 | 2/1991 | Suzuki et al. | 365/203 |
| 5,053,997 | 10/1991 | Miyamoto et al. | 365/233 X |
| 5,065,365 | 11/1991 | Hirayama | 365/233 X |
| 5,132,932 | 7/1992 | Tobita | 365/233 X |

*Primary Examiner*—Do Hyun Yoo
*Attorney, Agent, or Firm*—Lowe, Price, LeBlanc & Becker

[57] ABSTRACT

An improved DRAM is disclosed, in which a number of sense amplifiers to be activated simultaneously can be selected by using a bonding option method. An output signal $/\phi_A$ supplied from a bonding option circuit 11 is applied to column interlock releasing circuit 7. When an operation mode in which the number of the sense amplifiers to be activated simultaneously is large is selected, a column interlock releasing signal $/\phi$ is delayed, and enabling of a column decoder 3 is delayed. In the operation mode, in which the number of the sense amplifiers to be activated simultaneously is large, the enabling of the column decoder 3 is delayed, and a conducting timing of an IO gate circuit 16 is delayed. A sense amplifier 15 can sufficiently amplify a potential difference between bit lines, so that an error in the data reading operation is prevented.

9 Claims, 18 Drawing Sheets

1

SEMICONDUCTOR MEMORY DEVICE ALLOWING SELECTION OF THE NUMBER OF SENSE AMPLIFIERS TO BE ACTIVATED SIMULTANEOUSLY

This application is a continuation of application Ser. No. 07/903,400 filed Jun. 24, 1992, now abandoned.

BACKGROUND OF THE INVENTION

1. Field of the Invention

The present invention relates generally to semiconductor memory devices, and more particularly to a semiconductor memory device allowing selection of the number of sense amplifiers to be activated simultaneously. The invention has particular applicability to dynamic random access memories.

2. Description of the Background Art

In recent years, semiconductor memories such as dynamic random access memories (will be called as "DRAMs") and static random access memories (will be called as "SRAMs") have been used in various electronic equipments and have been integrated to a higher degree in accordance with the advance of manufacturing technology. Although the high integration of the semiconductor memories has brought about various advantages for reducing sizes and improving performance of electronic equipments, it also increases a possibility of error in data reading operations of the highly integrated semiconductor memory devices.

FIG. 1 is a block diagram of a DRAM, which shows the background of the invention (and also shows an embodiment of the invention, as will be described later). Referring to FIG. 1, the DRAM includes a memory cell array 1, a row decoder 2 for decoding row address signals RA0–RAi, a column decoder 3 for decoding column address signals CA0–CAi, a sense amplifier 15, and an IO gate 16. A row address buffer 13 receives row address signals RA0–RAi included in externally applied address signals A0–Ai, and applies the same to row decoder 2. A column address buffer 14 receives column address signals CA0–CAi included in address signals A0–Ai, and applies the same to column decoder 3 and address transition detecting (will be called as "ATD") circuit 9. Line 100 indicates a semiconductor substrate.

The DRAM further comprises a timing signal generator 17 which is responsive to a row address strobe signal /RAS and a column address strobe signal /CAS to generate various internal timing signals. Timing signal generator 17 is responsive to state control signals /RAS and /CAS to generate the timing signals required for controlling the DRAM shown in FIG. 1. A WE buffer 22 receives an externally applied write enable signal /WE. An OE buffer 23 receives an externally applied output enable signal /OE.

Input data DI to be written is applied through an input buffer 19 to a write buffer 18. Write buffer 18 applies the input data signal to memory cell array 1 through an IO line 24 and IO gate 16. In memory cell array 1, the input data signal is written in memory cells (not shown) selected by row decoder 2 and column decoder 3. In a reading operation, the data signal read from the memory cells designated by row decoder 2 and column decoder 3 is applied through IO gate 16 and IO line 24 to a preamplifier 20. The read data signal amplified by preamplifier 20 is further amplified by a main amplifier 21, and then is externally supplied as an output data DO.

The DRAM shown in FIG. 1 further includes a row pre-decoder 5, a sense amplifier activating circuit 6, a column interlock releasing circuit 7, a sense amplifier enabling circuit 8, an ATD circuit 9, a column decoder enabling circuit 10, a bonding option circuit 11, and a mode control circuit 12. These circuits will be described below in detail.

FIG. 8 is a circuit diagram of bonding option circuit 11 shown in FIG. 1. Referring to FIG. 8, bonding option circuit 11 includes a bonding pad 111 formed on semiconductor substrate 100, a high resistor 112, and cascade-coupled inverters 113 and 114. Bonding pad 111 is selectively connected to an input pin (or input lead) 110 by gold wire 115. Input pin 110 is grounded.

When bonding pad 111 is connected through gold wire 115 to grounded input pin 110, bonding option circuit 11 supplies a mode selecting signal $/\phi_A$ at a low level. When bonding pad 111 is not connected to input pin 110, bonding option circuit 11 supplies signal $/\phi_A$ at a high level. Mode selecting signal $/\phi_A$ is applied to mode control circuit 12 shown in FIG. 1. Mode control circuit 12 is responsive to signal $/\phi_A$ to perform the following control in the DRAM.

FIG. 9 is a schematic diagram showing sizes of memory cell array 1 which is simultaneously accessed in the DRAM shown in FIG. 1. A memory block MB1 shown in FIG. 9(A) has the size of 1024 bits in the X direction and 256 bits in the Y direction. Thus, 256 sense amplifiers (not shown) provided in memory block MB1 are simultaneously activated in one reading operation or one refresh. A memory block MB2 shown in FIG. 9(B) has the size of 512 bits in the X direction and 512 bits in the Y direction. Thus, 512 sense amplifiers (not shown) provided in memory block MB2 are simultaneously activated in one reading operation or one refresh.

The DRAM shown in FIG. 1 is responsive to a mode selection signal $/\phi_A$ supplied from bonding option circuit 11 to equivalently realize the DRAM of the type shown in either FIG. 9(A) or FIG. 9(B). Thus, the DRAM shown in FIG. 1 is responsive to signal $/\phi_A$ at the high level to form the DRAM shown in FIG. 9(A) (⅛ divisional operation), and is also responsive to signal $/\phi_A$ at the low level to form the DRAM shown in FIG. 9(B) (¼ divisional operation).

FIGS. 10 and 11 are circuit diagrams showing a front half 5a and a rear half 5b of row pre-decoder 5 shown in FIG. 1, respectively. Row pre-decoder 5 shown in FIG. 1 is formed of front half circuit 5a and rear half circuit 5b. Circuits 5a and 5b decode externally applied higher row address signals RAi, RAi-1 and RAi-2 to supply pre-decode signals AX0–AX7. Row address signal RAi indicates the most significant row address signal. When mode selecting signal $/\phi_A$ is at the low level, the most significant row address signal RAi is ignored. More specifically, when signal $/\phi_A$ is at the low level, pre-decode signals AX0–AX7 are not affected by the most significant row address signal RAi. Pre-decode signals AX0–AX7 are supplied to sense amplifier activating circuit 6 shown in FIG. 1.

FIG. 12 is a block diagram showing the ⅛ divisional operation of the DRAM shown in FIG. 1. Although memory cell array 1 is shown as one block in FIG. 1, memory cell array 1 is practically divided into, e.g., four memory blocks MBa, MBb, MBc and MBd, as shown in FIG. 12. Row decoder 2 is also divided into row decoders 2a, 2b, 2c and 2d which are provided for the memory blocks, respectively. Column decoder 3 is divided into column decoders 3a and 3b.

Regions AX0–AX7 shown in each memory block are accessed by corresponding pre-decode signals AX0–AX7, respectively. For example, when pre-decode signal AX1 is at the high level, a total of eight regions (hatched regions in the figure) in memory blocks MBa–MBd are accessed.

The block diagram of FIG. 12 shows the ⅛ divisional operation, i.e., the operation performed when mode selecting signal /ϕ$_A$ is at the high level. In the ⅛ divisional operation, eight regions in total are simultaneously accessed, so that memory block MB1 shown in FIG. 9(A) is equivalently realized.

FIG. 13 is a block diagram for showing the ¼ divisional operation of the DRAM shown in FIG. 1. When the ¼ divisional operation is selected, bonding option circuit 11 shown in FIG. 1 supplies mode selecting signal /ϕ$_A$ at the low level. Therefore, circuits 5a and 5b shown in FIGS. 10 and 11 supply pre-decode signals AX1 and AX5 at the high level. Consequently, as shown in FIG. 13, totally eight regions in total (hatched regions in the figure) in memory blocks MBa–MBd are simultaneously accessed. This means that the DRAM of the type shown in FIG. 9(B) is equivalently realized in the ¼ divisional operation.

FIG. 14 is a circuit block diagram showing, as an example, memory block MBc and its peripheral circuit shown in FIG. 12. Referring to FIG. 14, memory block MBc shown in FIG. 12 includes a total of sixteen regions MBc0–MBc15. Regions MBc0 and MBc1 are accessed in response to pre-decode signal AX0 at the high level. Similarly, regions MBc14 and MBc15 are accessed in response to pre-decode signal AX7 at the high level. Each region, e.g., region MBc0 comprises n sense amplifiers SA1–SAn connected to n bit line pairs, as shown in FIG. 14.

Sense amplifier enabling circuit 6 comprises a total of sixteen activation signal generating circuits (ASG) 60–75. For example, activation signal generating circuits 60 and 61 supply activation signals S$_N$ and S$_P$ in response to pre-decode signal AX0. All sense amplifiers SA1–SAn provided in region MBc0 are simultaneously activated in response to signals S$_N$ and S$_P$ supplied from activation signal generating circuit 60.

Column decoder 3b includes column selecting signal generating circuits CD1–CDn which generate column selecting signals Y1–Yn, respectively. Column selecting signal generating circuits CD1–CDn are enabled in response to an enable signal ϕ$_Y$ supplied from column decoder enabling circuit 10 shown in FIG. 1. Row decoder 2c comprises a total of sixteen word line drive circuits RD0–RD15. It is noted that the other memory blocks shown in FIG. 12 have the circuit constructions similar to that of the circuit shown in FIG. 14.

FIG. 15 is a circuit diagram of one memory cell column in the memory block. Referring to FIG. 15, memory cell MC is connected to one bit line BL1 forming the bit line pair. Memory cell MC includes a switching transistor Qs and a capacitor Cs holding signal charges. Transistor Qs is turned on in response to a word line signal WL. Bit line pair BL1 and /BL1 is connected to IO line pair IO and /IO through NMOS transistors Q8 and Q9 forming a Y-gate circuit. Transistors Q8 and Q9 operate in response to column selecting signal Y1.

Sense amplifier SA1, which is provided for amplifying a small or slight potential difference between bit lines BL1 and /BL1, includes NMOS transistors Q1 and Q2 and PMOS transistors Q3 and Q4. Sense amplifier SA1 is activated in response to activation signals S$_N$ and S$_P$. Specifically, there are provided transistors Q$_{SN}$ and Q$_{SP}$ for the activation, which are turned on in response to signals S$_N$ and S$_P$.

In the reading operation, word line signal WL rises after the equalization of bit line pair BL1 and /BL1. Since transistor Qs is turned on, a small potential difference appears between bit lines BL1 and /BL1 in accordance with the signal charge stored in memory cell MC. Sense amplifier SA1 is activated in response to activation signals S$_N$ and S$_P$ to amplify the slight potential difference between bit lines BL1 and /BL1. After the amplification by sense amplifier SA1, transistors Q8 and Q9 are turned on by column selecting signal Y1 at the high level applied thereto, so that the amplified data signal is transmitted to IO line pair IO and /IO. The data signal transmitted to IO line pair is amplified by preamplifier 20 and main amplifier 21 shown in FIG. 1, and then is externally supplied as output data DO.

FIG. 16 is a circuit diagram of column interlock releasing circuit 7 and sense amplifier enabling circuit 8 shown in FIG. 1. Referring to FIG. 16, circuit 8a is responsive to externally applied signal /RAS to generate signals ϕ$_{NF}$, ϕ$_N$ and ϕ$_P$. Circuit 7a is responsive to signals ϕ$_N$ and /RAS to supply a column interlock releasing signal /ϕ.

FIG. 17 is a circuit diagram of one activation signal generating circuit (ASG) 60 shown in FIG. 14. Activation signal generating circuit 60 is responsive to pre-decode signal AX0 and signals ϕ$_P$, ϕ$_N$ and ϕ$_{NF}$ to generate sense amplifier activation signals S$_P$ and S$_N$. Generated signals S$_P$ and S$_N$ are applied to gates of transistors Q$_{SP}$ and Q$_{SN}$ shown in FIG. 15, respectively.

FIGS. 18 and 19 are circuit diagrams of front and rear halves of ATD circuit 9 shown in FIG. 1. Front half circuit 9a shown in FIG. 18 is responsive to the transition of column address signal CAi to generate a pulse signal CATi. Rear half circuit 9b shown in FIG. 19 is responsive to column interlock releasing signal /ϕ and signal CATi to generate a pulse ATD, which is applied to column decoder enabling circuit 10 shown in FIG. 1.

FIG. 20 is a circuit diagram of column decoder enabling circuit 10 shown in FIG. 1. Referring to FIG. 20, column decoder enabling circuit 10 is responsive to pulse ATD and column interlock releasing signal /ϕ to generate column decoder enable signal ϕ$_Y$.

As already stated, DRAM shown in FIG. 1 can selectively operate in the types or operation modes shown in either FIG. 9(A) or FIG. 9(B) by using the bonding option circuit. The constructions in FIG. 9(A) and FIG. 9(B) differ from each other in the number of the sense amplifiers to be activated simultaneously. Specifically, when the DRAM operates in the operation mode shown in FIG. 9(B), the number of the sense amplifiers to be activated simultaneously is double the number in the operation mode shown in FIG. 9(A).

Generally, as the number of the sense amplifiers to be activated simultaneously increases, a peak value of the current consumed in a short activating period increases. Therefore, power supply potential VDD decreases in this short period, and thus amplifying capability of the sense amplifier decreases. As a result, transistors Q8 and Q9 are turned on before, e.g., sense amplifier SA1 shown in FIG. 15 sufficiently amplifies the slight potential difference between bit lines BL1 and /BL1, so that, in some cases, the data signal on bit line pair BL1 and /BL1 may be inverted due to the signal charges remaining on the IO line pair. This means that error is caused in the data reading operation.

When the DRAM operates in the operation mode shown in FIG. 9(B), larger number of sense amplifiers are simultaneously activated, so that the possibility of error in the data reading operation increases, as compared with the case shown in FIG. 9(A).

SUMMARY OF THE INVENTION

An object of the invention is to prevent possible error in the data reading operation of a semiconductor memory device in which the number of sense amplifiers to be activated simultaneously can be selected.

Another object of the invention is to prevent possible error in the data reading operation of a dynamic random access memory device (DRAM) in which the number of sense amplifiers to be activated simultaneously can be selected.

Briefly stated, a semiconductor memory device according to the invention includes; a plurality of sense amplifiers connected to a plurality of bit lines, respectively; a data line for transmitting a data signal supplied from the plurality of bit lines; a plurality of switching elements, each of which is connected between the data line and corresponding one of the plurality of bit lines; a selective conducting circuit which is responsive to an externally applied column address signal to selectively rendering conductive one of the switching elements; a sense amplifier number determining circuit which determines the number of the sense amplifiers to be activated simultaneously; and a timing control circuit which is responsive to an output signal supplied from the sense amplifier number determining circuit for controlling an operation timing of the selectively conducting circuit.

In the operation, the timing control circuit controls the operation timing of the selective conducting circuit in accordance with the number of the sense amplifiers to be activated simultaneously. Therefore, the conducting timings of the switching elements vary, depending on the number of the sense amplifiers to be activated simultaneously, so that the data signal on the bit line can be sufficiently amplified by the sense amplifier.

According to another aspect of the invention, a semiconductor memory device includes a plurality of bit lines; a plurality of sense amplifiers connected to the plurality of bit lines, respectively; a column decoder which decodes an externally applied column address signal; a plurality of switching elements, each of which connected between the data line and corresponding one of the plurality of bit lines, and is selectively turned on in response to an output signal supplied from the column decoder; an enabling circuit which is responsive to an externally applied state control signal to enable the column decoder; a sense amplifier number determining circuit which determines the number of the sense amplifiers to be activated simultaneously; and an enable delaying circuit which is responsive to an output signal supplied from the sense amplifier number determining circuit to delay an enabling timing of the enabling circuit.

In the operation, the enable delaying circuit delays the enabling timing of the column decoder in accordance with the number of the sense amplifiers to be activated simultaneously. Therefore, the data signal on the bit line is applied to the data line after being sufficiently amplified by the sense amplifier, which prevents the inversion of the data signal due to the connection of the bit line and the data line.

In accordance with still another aspect of the invention, a semiconductor memory device comprises a plurality of sense amplifiers connected to a plurality of bit lines, respectively; a data line for transmitting a data signal supplied from the bit lines; a plurality of switching elements, each of which is connected between the data line and corresponding one of the plurality of bit lines; a selective conducting circuit which is responsive to an externally applied column address signal to selectively rendering conductive one of the switching elements; a sense amplifier number determining circuit which determines the number of the sense amplifiers to be activated simultaneously; and a different timing activating circuit which is responsive to an output signal supplied from the sense amplifier number determining circuit to activate the sense amplifiers to be activated simultaneously at partially different timings, respectively.

In operation, the different timing activating circuit activates the sense amplifiers at partially different timings in accordance with the number of the sense amplifiers to be activated simultaneously. Therefore, even in a case that larger number of sense amplifiers are activated simultaneously, the reduction of the power supply potential during a short period for activation is prevented, and thus the error in the data reading operation is prevented.

In accordance with a further aspect of the invention, a semiconductor memory device includes a plurality of bit lines; a plurality of sense amplifiers connected to the plurality of bit lines, respectively; a data line for transmitting a data signal supplied from the bit lines; a column decoder which decodes an externally applied column address signal; a plurality of switching elements, each of which is connected between the data line and corresponding one of the plurality of bit lines, and is selectively turned on in response to an output signal supplied from the column decoder; a sense amplifier number determining circuit which determines the number of the sense amplifiers to be activated simultaneously; and a different timing activating circuit which is responsive to an output signal supplied from the sense amplifier number determining circuit to activate the sense amplifiers to be activated simultaneously at partially different timings, respectively.

In operation, the different timing activating circuit activates the sense amplifiers at partially different timings in accordance with the number of the sense amplifiers to be activated simultaneously. Therefore, even in a case that larger number of sense amplifiers are activated simultaneously, the reduction of the power supply potential during a short period for activation is prevented, and thus the error in the data reading operation is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
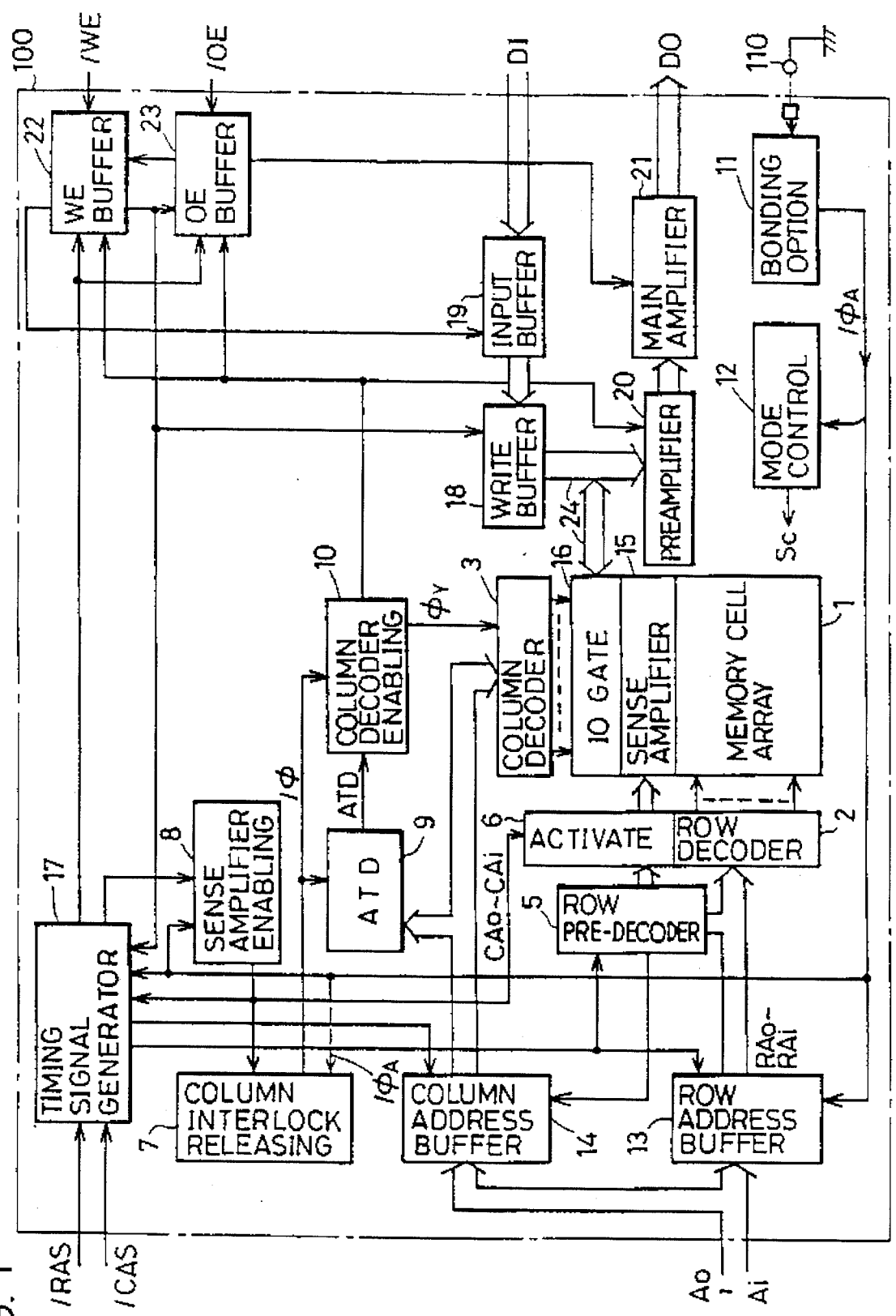
FIG. 1 is a block diagram of a DRAM showing an embodiment of the invention.

Referring to FIG. 1, the improvement is that a mode selecting signal /$\phi_A$ supplied from bonding option circuit 11 is fed to column interlock releasing circuit 7 (as indicated by dotted line in the figure), and that modification is made in column interlock releasing circuit 7, which will be described later.

Figure 2:
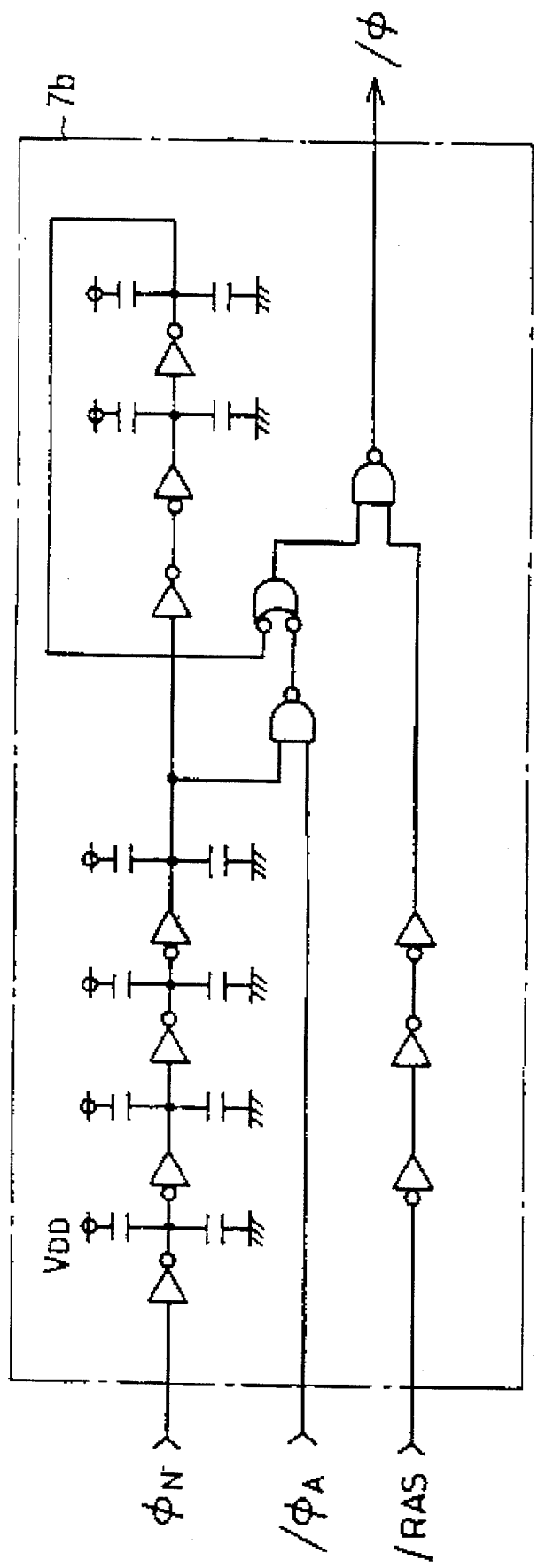
FIG. 2 is a circuit diagram of a column interlock releasing circuit shown in FIG. 1.

FIG. 2 is a circuit diagram of an improved rear half circuit of column interlock releasing circuit 7 shown in FIG. 1. This embodiment also uses the circuit 8a shown in FIG. 16, and uses a circuit 7b shown in FIG. 2 in place of the circuit 7a. Referring to FIG. 2, the improved circuit 7b receives, in addition to signals $\phi_N$ and /RAS, a mode selecting signal /$\phi_A$ supplied from bonding option circuit 11. Therefore, the improved circuit 7b supplies column interlock releasing signal /$\phi$ which is further delayed, when the DRAM shown in FIG. 1 operates in the operation mode shown in FIG. 9(B) (i.e., in the ¼ divisional operation), as compared with the case in FIG. 9(A) (i.e., in the ⅛ divisional operation).

Figure 3:
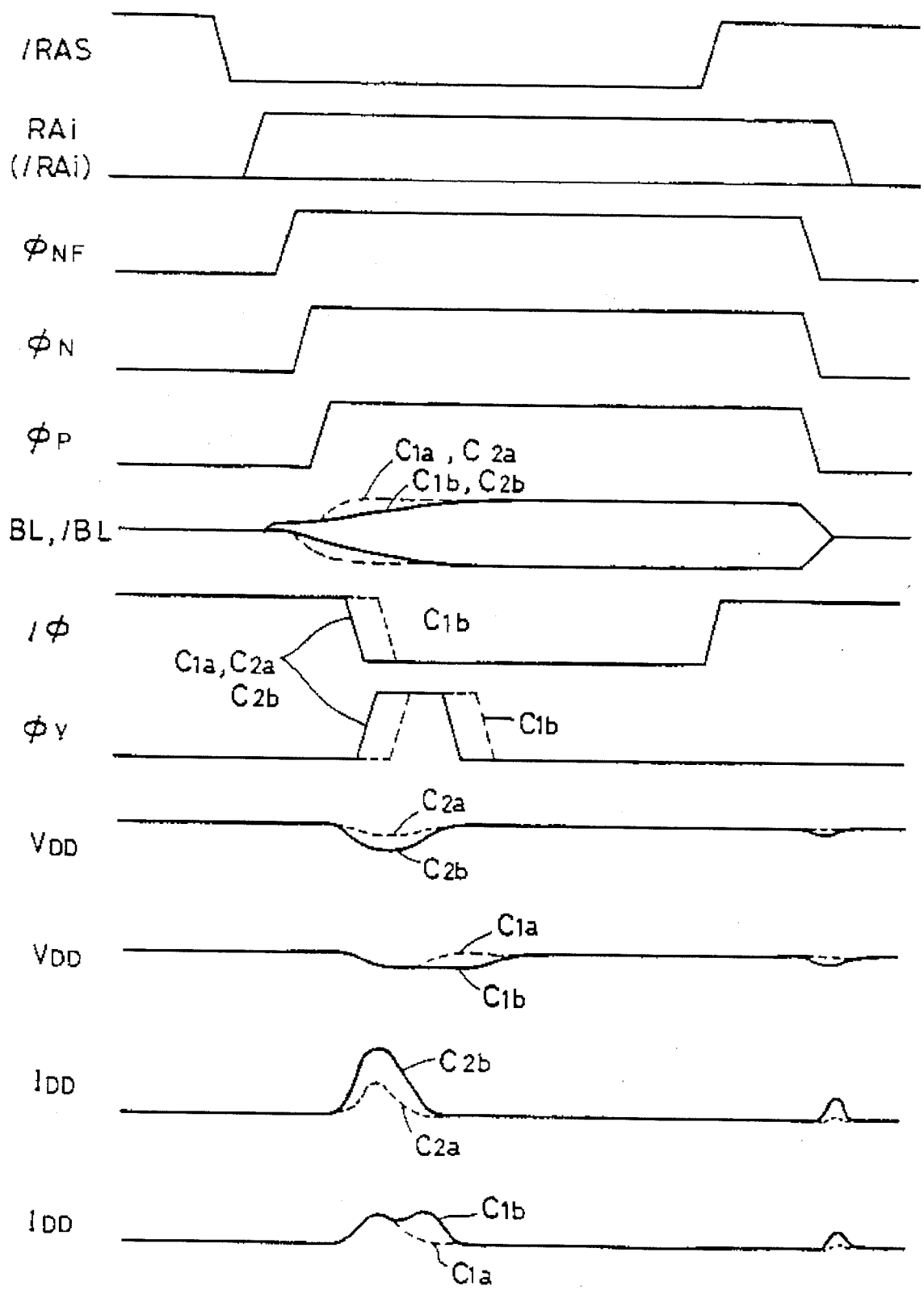
FIG. 3 is a time chart for showing an operation of a DRAM using an improved circuit shown in FIG. 2.
Figure 16:
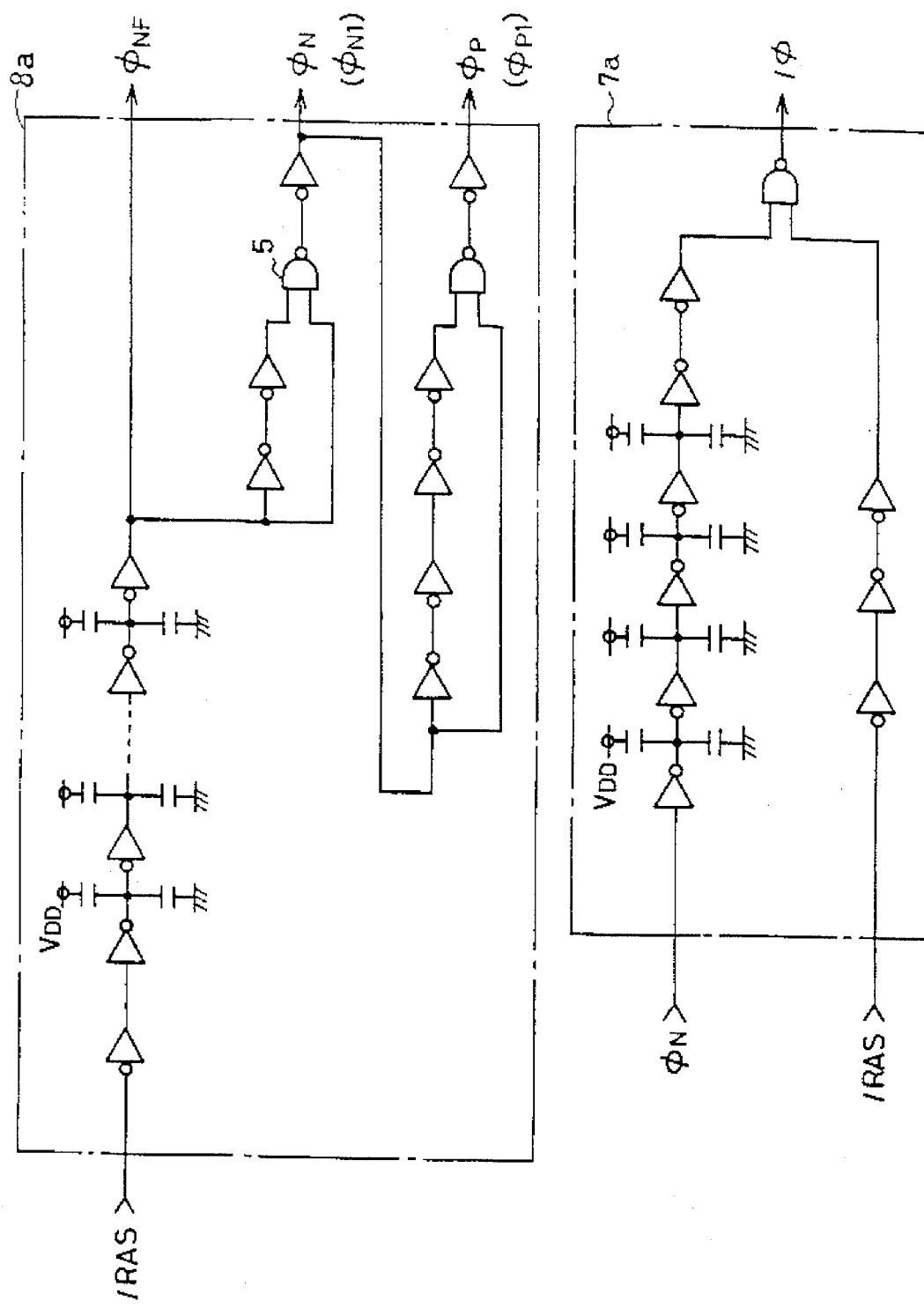
FIG. 16 is a circuit diagram of a sense amplifier enabling circuit and a column interlock releasing circuit shown in FIG. 1.
Figure 17:
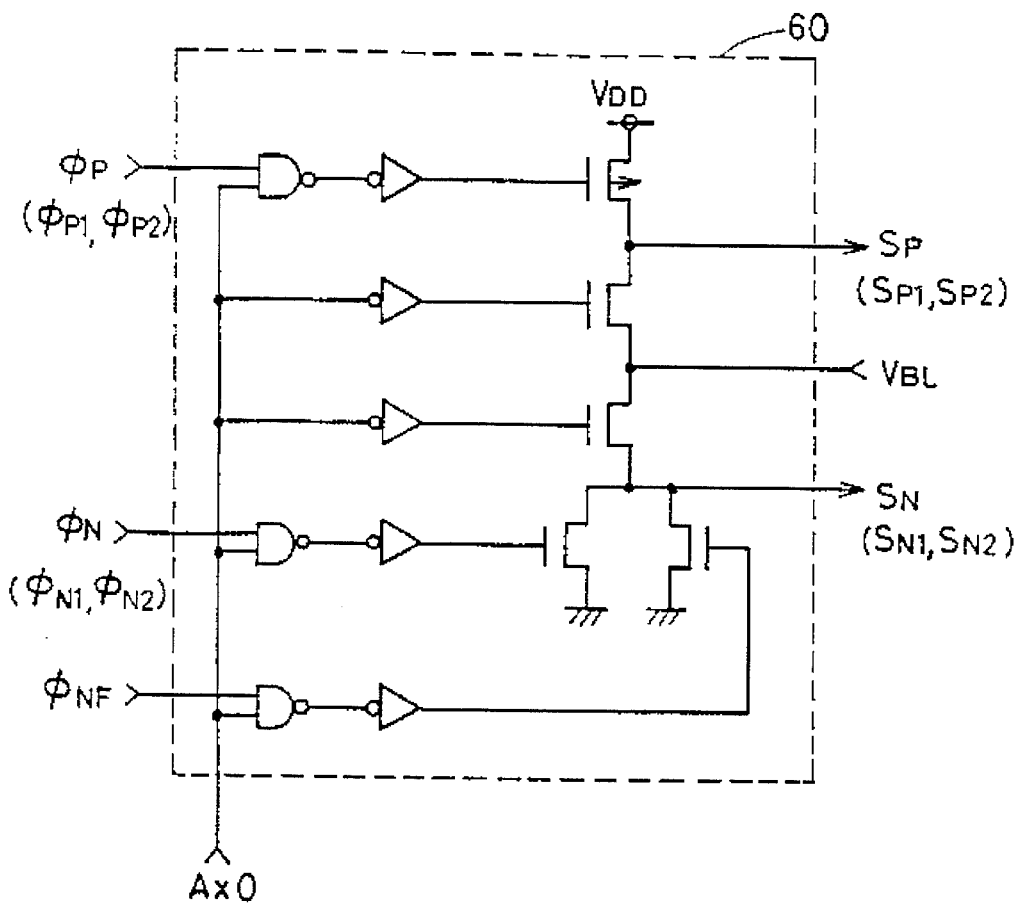
FIG. 17 is a circuit diagram of one activation signal generating circuit shown in FIG. 14.
Figure 18:
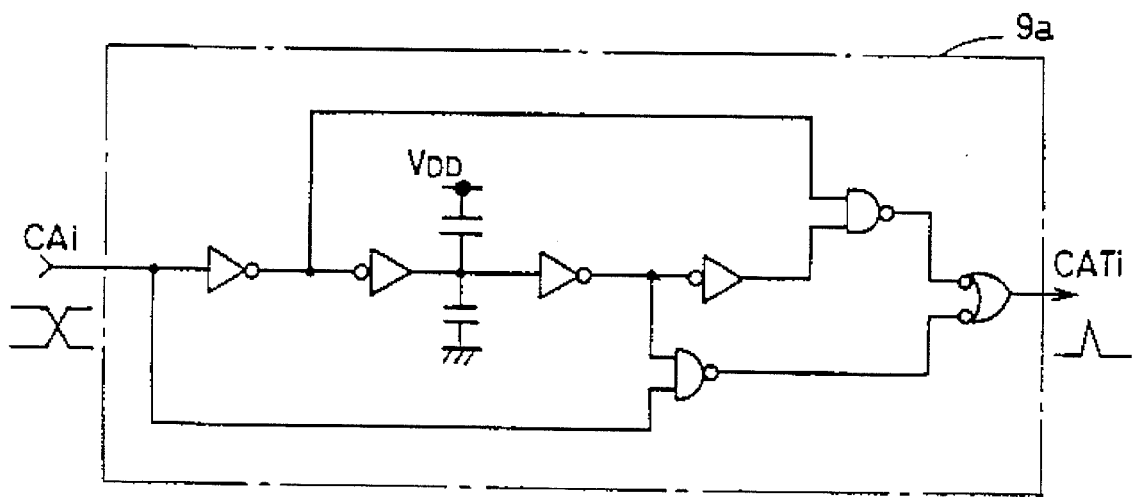
FIG. 18 is a circuit diagram of a front half of an ATD circuit 9 shown in FIG. 1.
Figure 19:
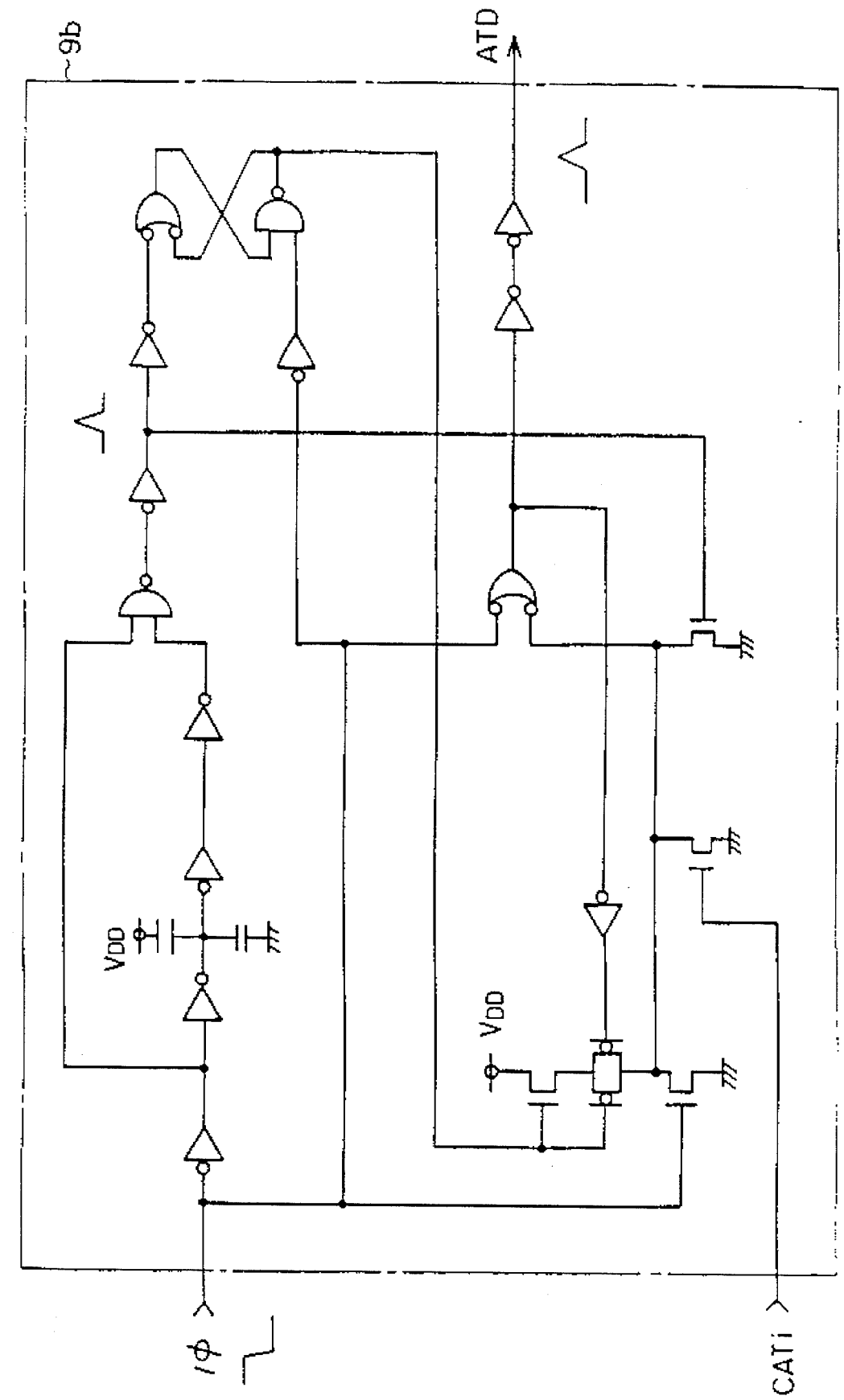
FIG. 19 is a circuit diagram of a rear half of an ATD circuit 9 shown in FIG. 1.
Figure 20:
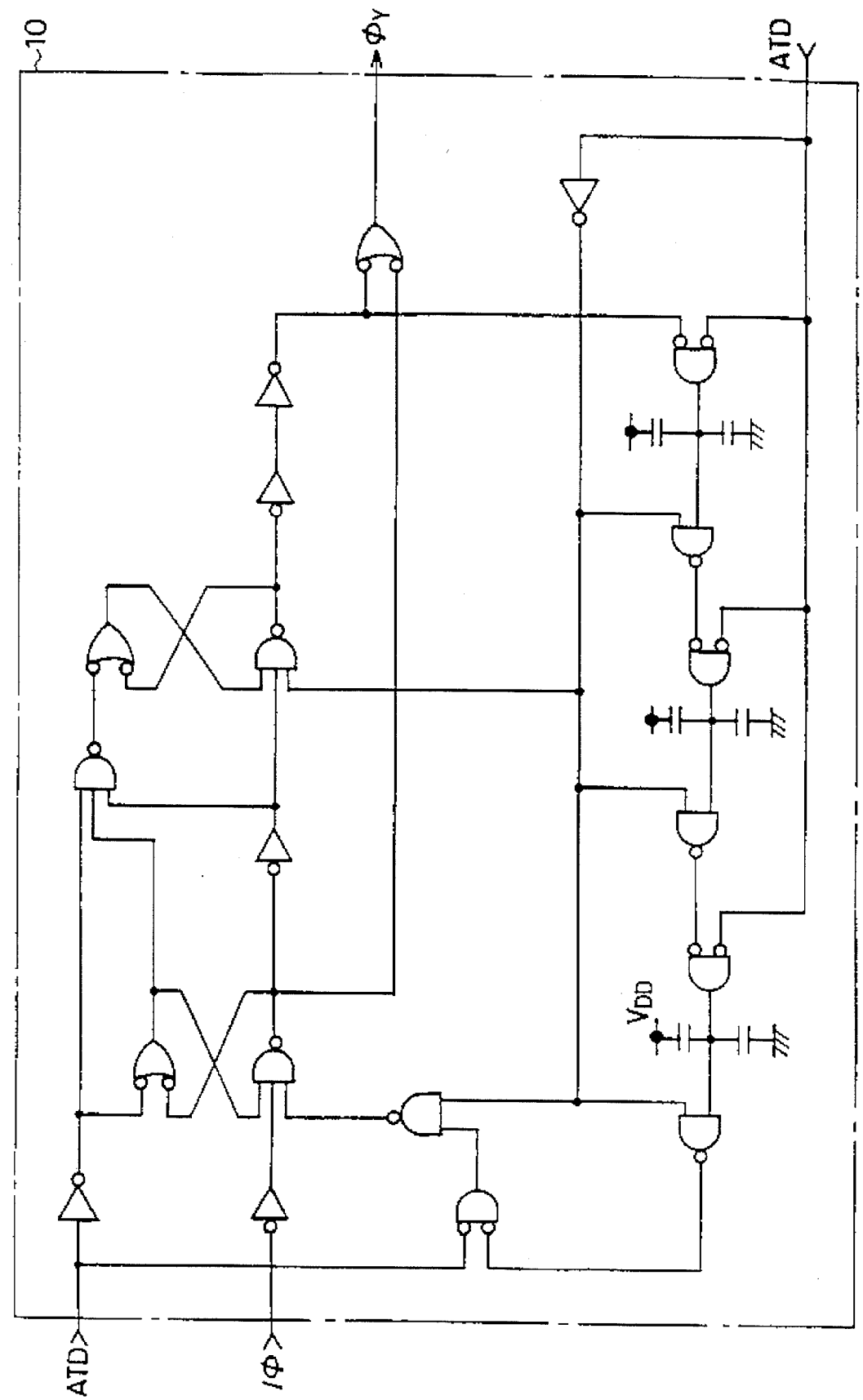
FIG. 20 is a circuit diagram of a column decoder enabling circuit shown in FIG. 1.

FIG. 3 is a time chart showing an operation of the DRAM using the improved circuit 7b shown in FIG. 2. Line C1a in FIG. 3 indicates the change of the control signal in a case that the DRAM operates in the operation mode shown in FIG. 9(A). Line C2a indicates the change of the control signal in a case that the DRAM operates in the operation mode shown in FIG. 9(B). For comparison, changes of control signals in the unimproved DRAM, i.e., DRAM in which the rear half circuit 7a shown in FIG. 16 is employed, are indicated by lines C2a and C2b. Line C2a indicates a case that the unimproved DRAM operates in the operation mode shown in FIG. 9(A). Line C2b indicates a case that the unimproved DRAM operates in the operation mode shown in FIG. 9(B).

Figure 9:
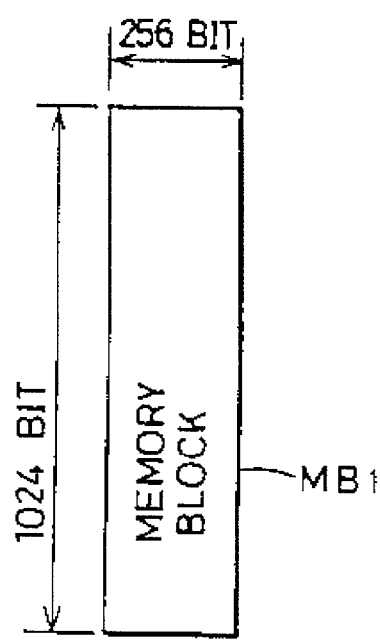
FIGS. 9(A) and 9(B) are a schematic diagram showing sizes of a memory cell array in a ⅛ divisional operation and a ¼ divisional operation of a DRAM shown in FIG. 1.
Figure 9:
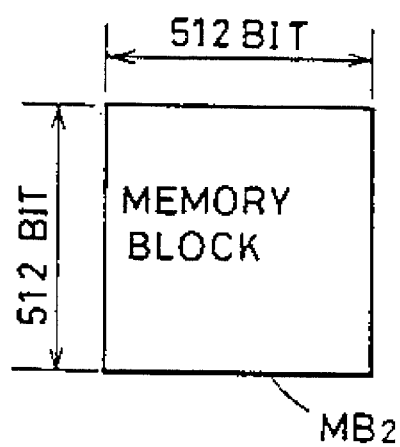
Figure 10:
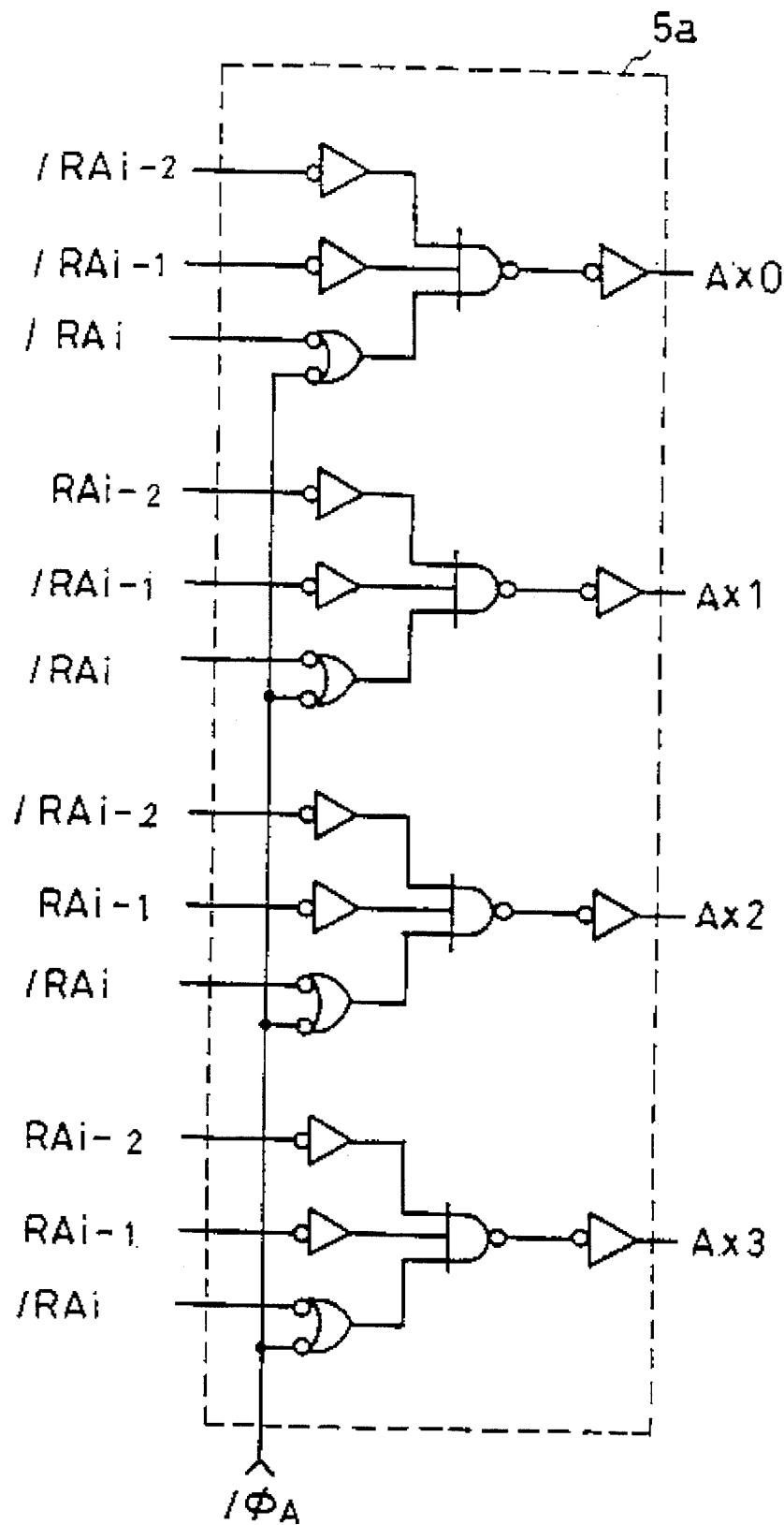
FIG. 10 is a circuit diagram of a front half of a row pre-decoder shown in FIG. 1.
Figure 11:
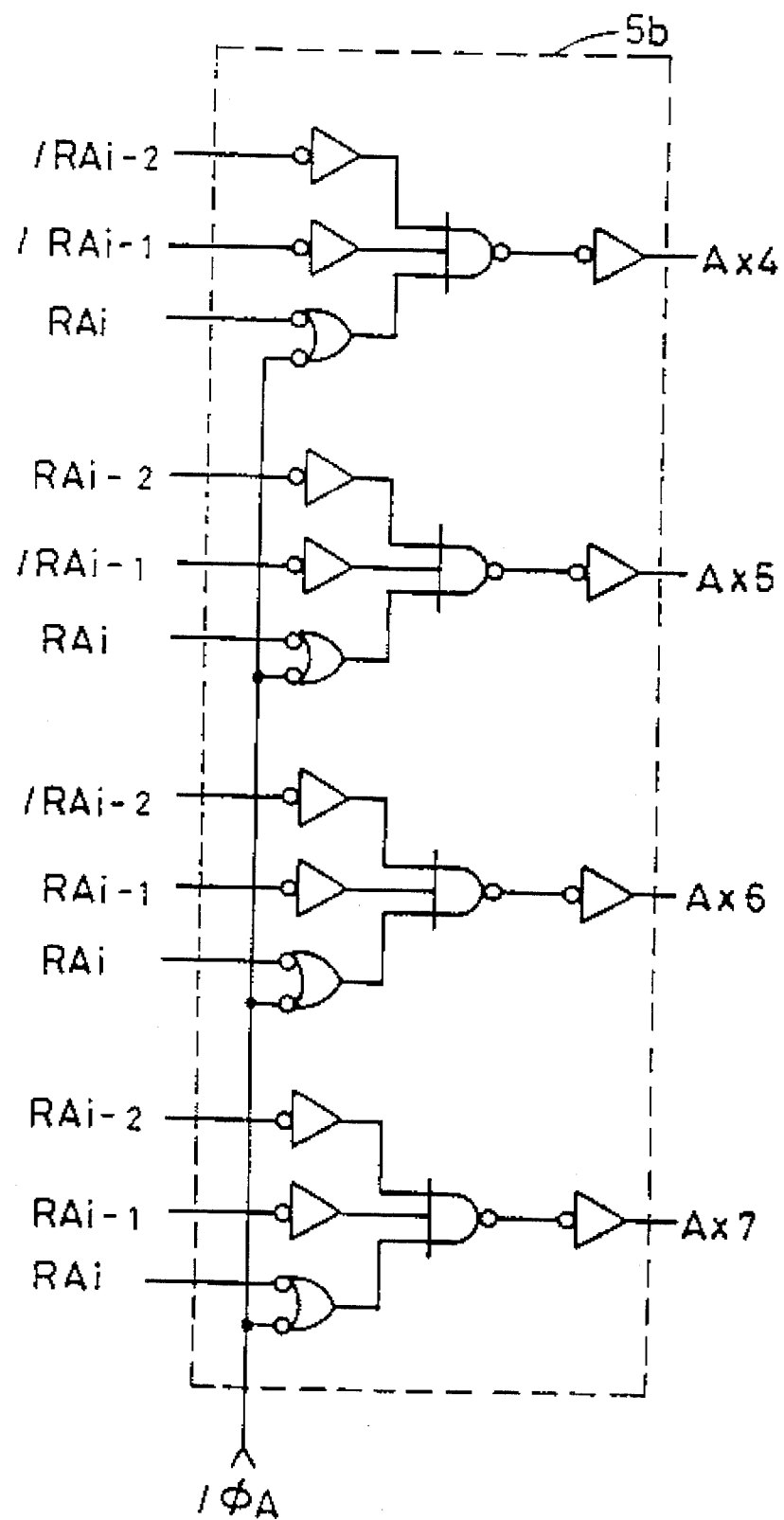
FIG. 11 is a circuit diagram showing a rear half of a row pre-decoder shown in FIG. 1.
Figure 12:
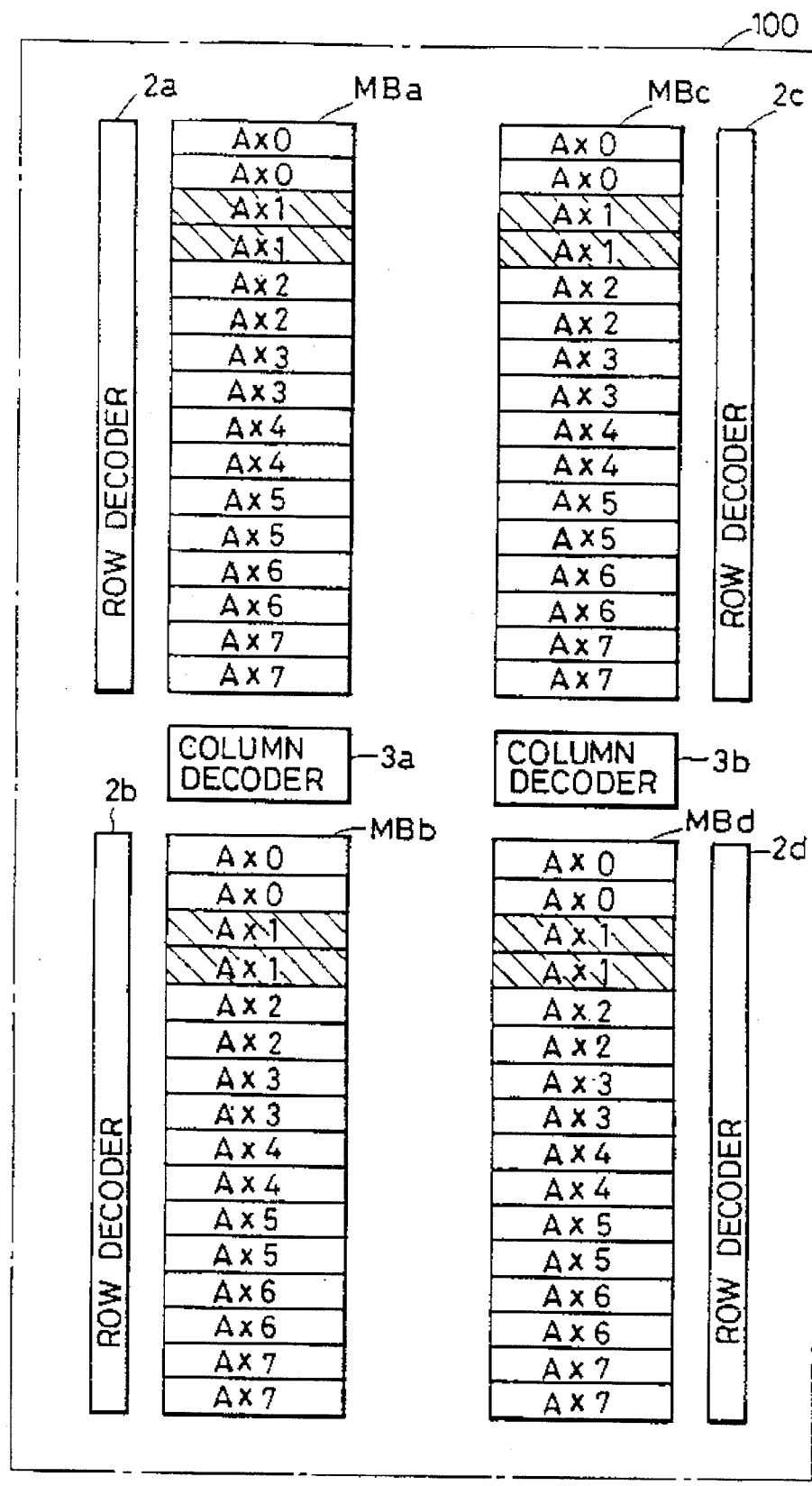
FIG. 12 is a block diagram for showing a ⅛ divisional operation of a DRAM shown in FIG. 1.
Figure 13:
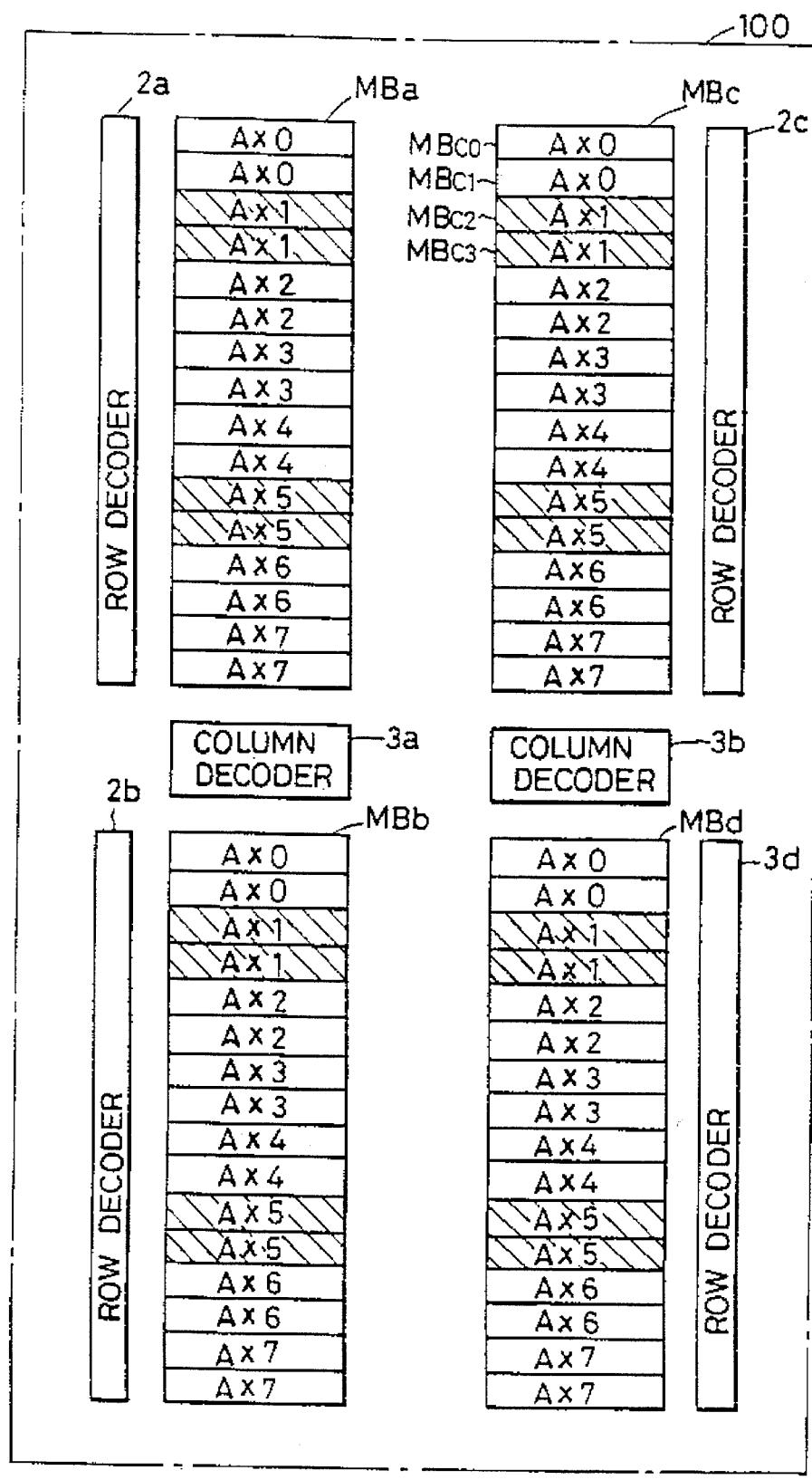
FIG. 13 is a block diagram for showing a ¼ divisional operation of a DRAM shown in FIG. 1.
Figure 14:
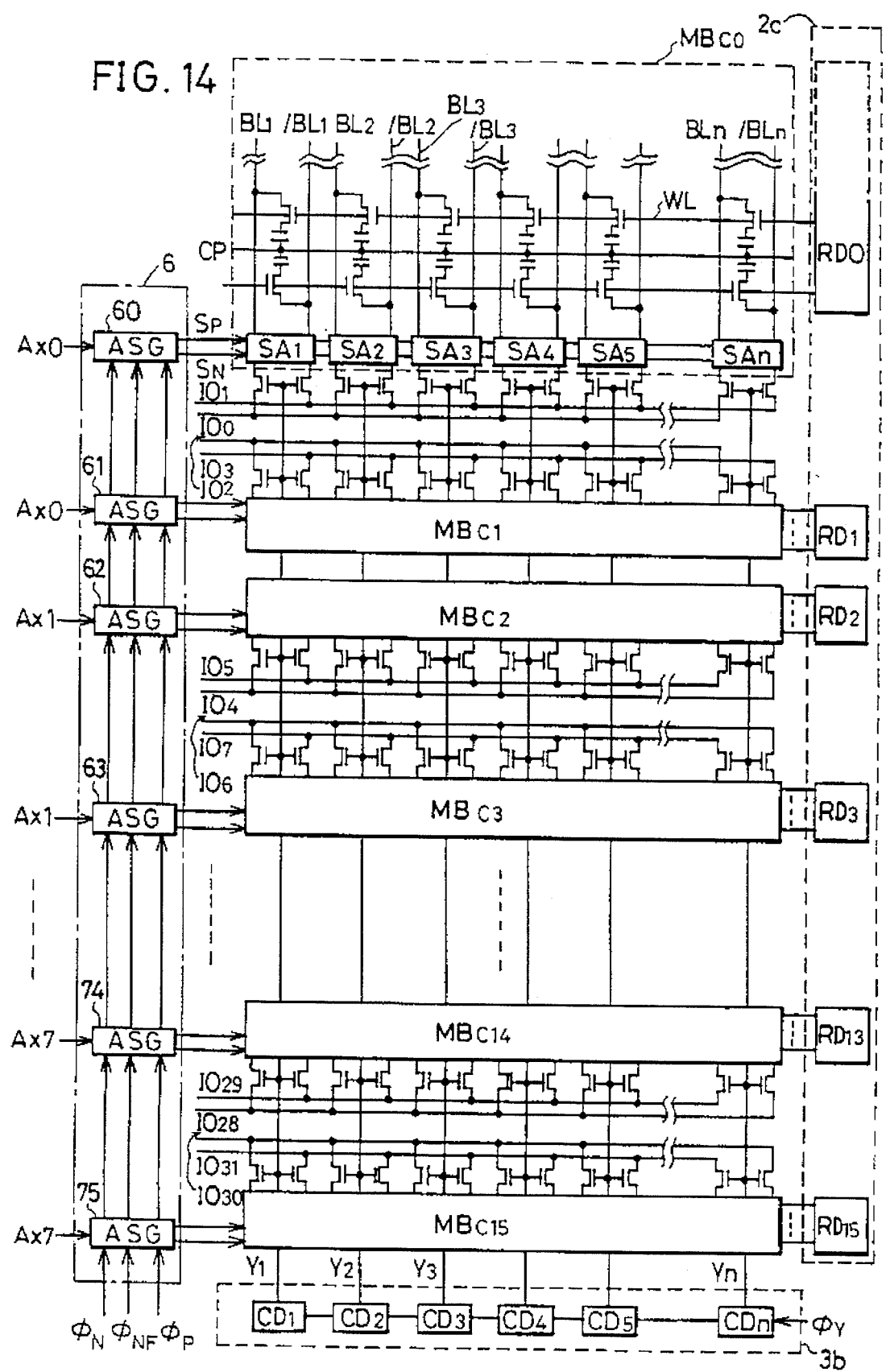
FIG. 14 is a circuit block diagram showing a memory block MBc and its peripheral circuit shown in FIG. 12.

Referring to FIG. 3, in the operation mode in FIG. 9(B) of the DRAM using the rear half circuit 7b shown in FIG. 2, the lowering of column interlock releasing signal /$\phi$ is delayed (line C1b). Therefore, a period for which column decoder enable signal $\phi_Y$ has the high level is delayed (line C1b), and thus the enabling of column decoder 3 is delayed.

Figure 15:
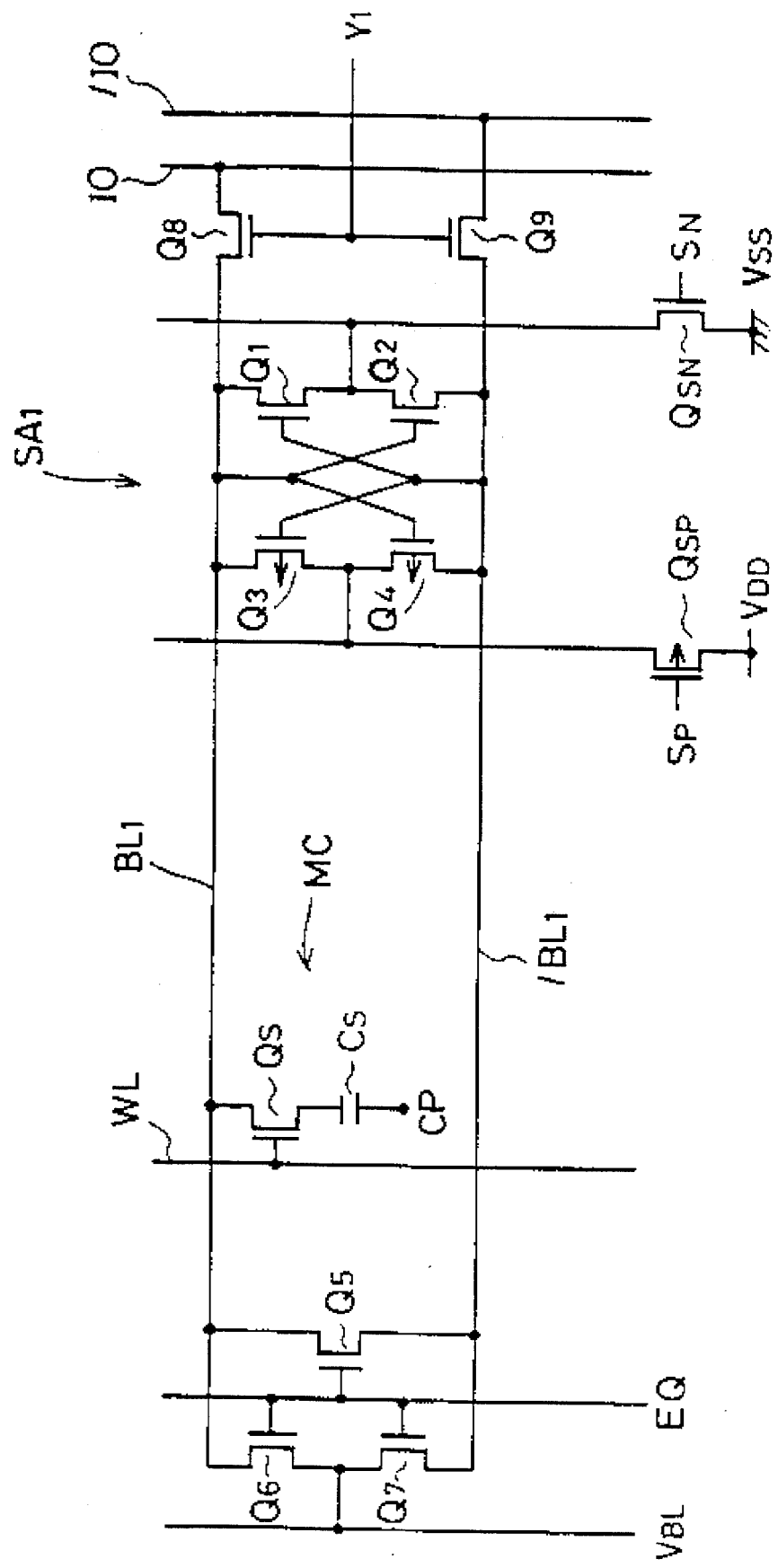
FIG. 15 is a circuit diagram of one memory cell column.

Consequently, the generation of column selecting signal Y by column decoder 3 is delayed, so that the sense amplifier can further amplify sufficiently the potential difference between the bit lines. For example, referring to FIG. 15, since the supply timing of column selecting signal Y1 at the high level is delayed, transistors Q8 and Q9 are turned on after the sufficient amplification by sense amplifier SA1. Therefore, data signal on bit line pair BL1 and /BL1 is prevented from being inverted by the signal charges remaining on the IO line pair. In other words, error in the data reading operation is prevented.

When the DRAM using the circuit 7b shown in FIG. 2 operates in the operation mode shown in FIG. 9(A), column interlock releasing signal /$\phi$ is not delayed. In this case, the number of the sense amplifiers which are simultaneously activated is relatively small, so that the error in the data reading operation is not caused.

Figure 4:
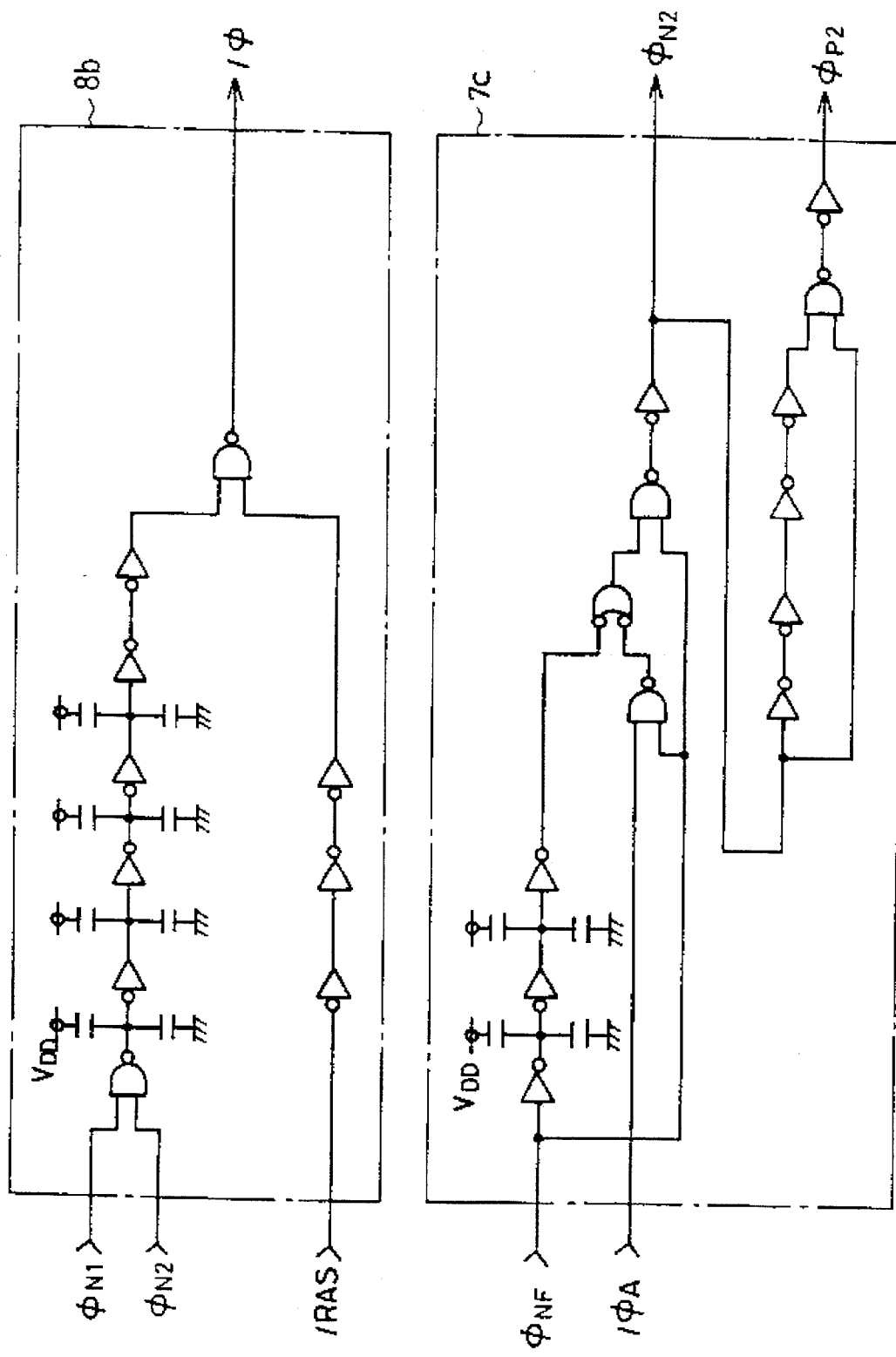
FIG. 4 is a circuit diagram of a sense amplifier enabling circuit and a column interlock releasing circuit, showing another embodiment of the invention.

FIG. 4 is a circuit diagram of a sense amplifier enabling circuit 8 and column interlock releasing circuit 7, showing another embodiment of the invention. Improved sense amplifier enabling circuit 8 in this embodiment includes the front half circuit 8a shown in FIG. 16 and the circuits 8b shown in FIG. 4. The circuit 8a is responsive to signal /RAS to generate signals $\phi_{NF}$, $\phi_{N1}$ and $\phi_{P1}$. Circuit 7c is responsive to mode selecting signal /$\phi_A$ and signal $\phi_{NF}$ to generate signals $\phi_{N2}$ and $\phi_{P2}$. Circuit 8b is responsive to signals /RAS, $\phi_{N1}$ and $\phi_{N2}$ to generate column interlock releasing signal /$\phi$.

Figure 5:
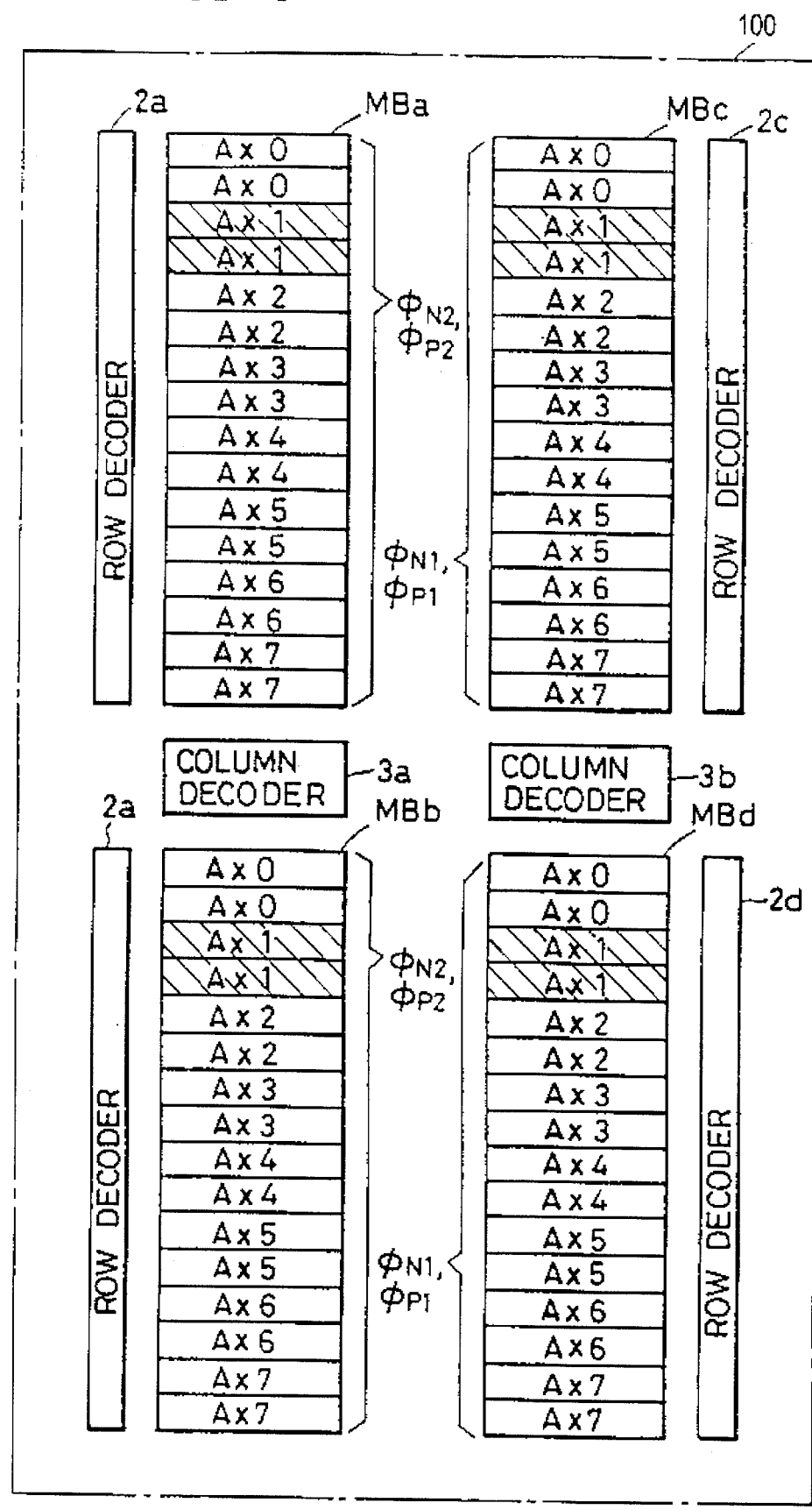
FIG. 5 is a block diagram of memory blocks in an operation mode shown in FIG. 9(A) of a DRAM using the circuit shown in FIG. 4.

FIG. 5 is a block diagram of the memory blocks in the operation mode shown in FIG. 9(A) of the DRAM using the circuit shown in FIG. 4. As shown in FIG. 5, the sense amplifiers in memory blocks MBa and MBb are activated in response to signals $\phi_{N2}$ and $\phi_{P2}$. The sense amplifiers in memory blocks MBc and MBd are activated in response to signals $\phi_{N1}$ and $\phi_{P1}$. When the improved DRAM operates in the operation mode shown in FIG. 9(A) (i.e., ⅛ divisional operation), the corresponding regions in the respective memory blocks MBa–MBd are simultaneously accessed. For example, when pre-decode signal AX1 is generated from row pre-decoder 5, sense amplifiers in the hatched regions in FIG. 5 are simultaneously activated.

Figure 6:
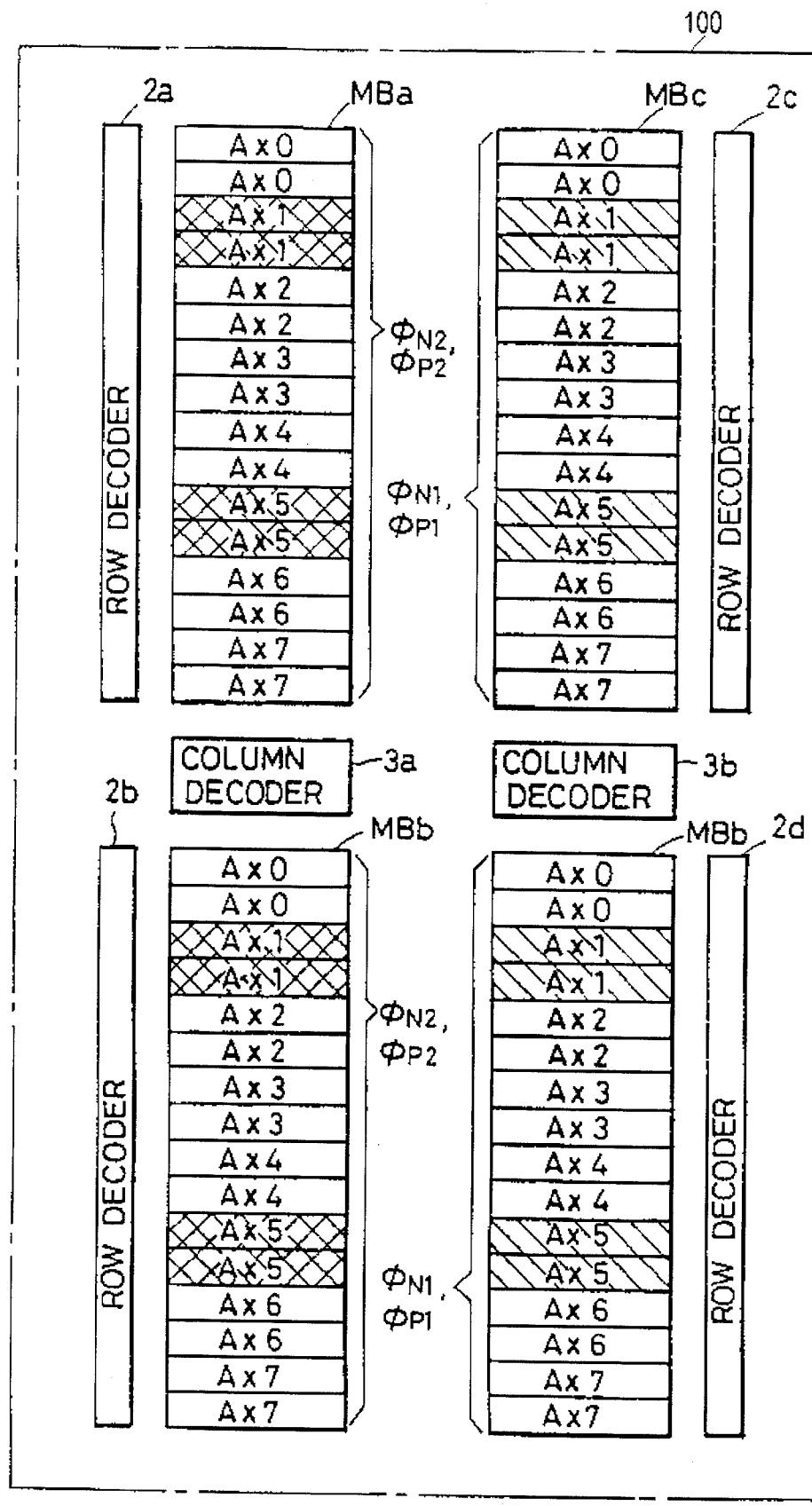
FIG. 6 is a block diagram of memory blocks in an operation mode shown in FIG. 9(B) of a DRAM using a circuit shown in FIG. 4.

FIG. 6 is a block diagram of the memory blocks in the operation mode (¼ divisional operation) shown in FIG. 9(B) of the DRAM using the circuit shown in FIG. 4. In this operation mode, signals $\phi_{N2}$ and $\phi_{P2}$ are activated at the timing delayed from that of signals $\phi_{N1}$ and $\phi_{P1}$. For example, since pre-decode signals AX1 and AX5 are generated in this operation mode, the sense amplifiers in the hatched regions in memory blocks MBc and MBd are first activated, and then the sense amplifiers in double hatched regions in memory blocks MBa and MBb are activated. Specifically, after the sense amplifiers in the hatched regions in memory blocks MBc and MBd are activated in response to signals $\phi_{N1}$ and $\phi_{P1}$, the sense amplifiers in double hatched regions in memory blocks MBa and MBb are activated.

Figure 7:
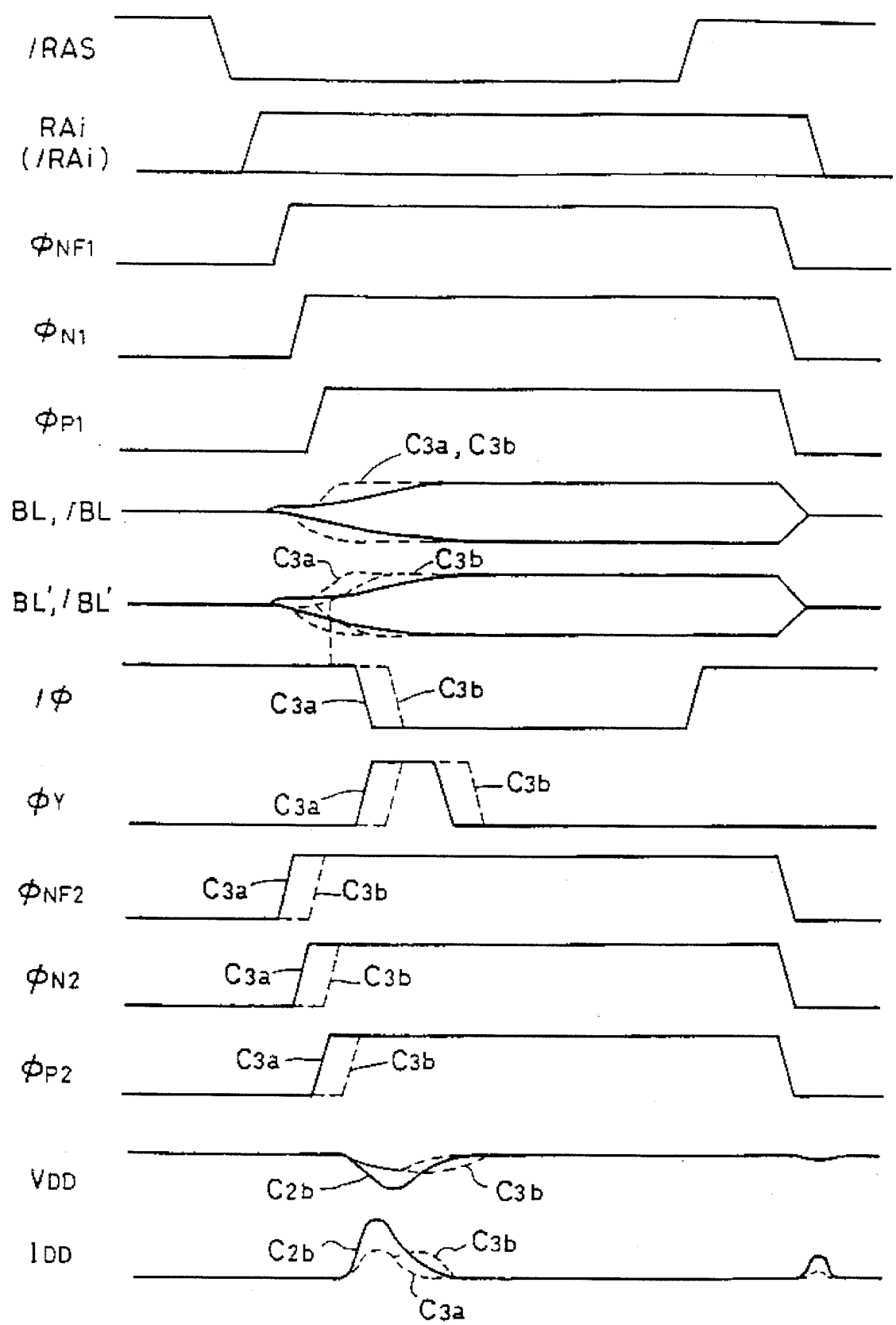
FIG. 7 is a time chart showing an operation of a DRAM using a circuit shown in FIG. 4.
Figure 8:
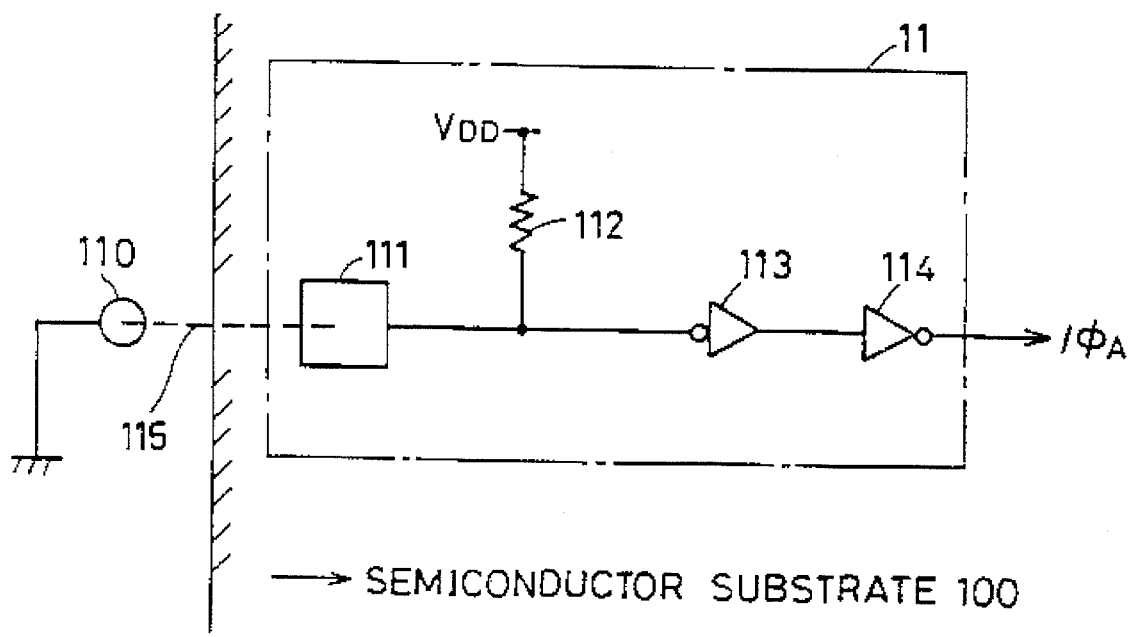
FIG. 8 is a circuit diagram of a bonding option circuit shown in FIG. 1.

FIG. 7 is a time chart showing the operation of the DRAM using the circuit shown in FIG. 4. Referring to FIG. 7, line C3a indicates the change of the control signal during the operation of the improved DRAM in the operation mode shown in FIG. 9(A). Line C3b indicates the change of the control signal during the operation of the improved DRAM in the operation mode shown in FIG. 9(B)

Column interlock releasing signal /$\phi$ is delayed when the improved DRAM operates in the operation mode shown in FIG. 9(B) (¼ divisional operation), as compared with the operation mode (⅛ divisional operation) in FIG. 9(A) (line C3b). Therefore, the period for which column decoder enable signal $\phi_Y$ has the high level is delayed (line C3b). In addition to this, signal $\phi_{N2}$ and $\phi_{P2}$ are delayed in the operation mode in FIG. 9(B). Consequently, in the ¼ divisional operation, signals $\phi_{N2}$ and $\phi_{P2}$ rise after the rising of signals $\phi_{N1}$ and $\phi_{P1}$. In other words, the sense amplifiers to be activated simultaneously are activated at the partially different timings in the ¼ divisional operation. Consequently, power consumption reduces as indicated by line C3b, and thus lowering of the voltage of power supply potential VDD is suppressed (line C3b). Since the level of power supply potential VDD does not lower to a large extent in the ¼ divisional operation, lowering of the amplifying capacities of the sense amplifiers is prevented. As a result, the error in the data reading operation is prevented.

When the DRAM operates in the operation mode in FIG. 9(B) (¼ divisional operation), larger number of sense amplifiers are simultaneously activated, as described above. In the first embodiment (shown in FIG. 2), column decoder enable signal $\phi_Y$ is delayed, whereby the error in the data reading operation is prevented. In the second embodiment (shown in FIG. 4), the sense amplifiers to be activated simultaneously are activated in the partially different timings in the ¼ dividing operation, whereby the error in the data reading operation is prevented.

Each of the foregoing embodiments uses mode selecting signal $/\phi_A$ generated by bonding option circuit 11 in FIG. 1. It should be noted that a method by aluminum master slice may be used instead of the bonding option method. Although the invention is applied to the DRAM in the above description, the invention may be applied, in general, to semiconductor memories.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a plurality of bit lines;
    a plurality of sense amplifiers for amplifying signals on respective bit lines;
    a circuit for providing a determination signal designating which of a first number or a second, greater number of sense amplifiers are to be simultaneously enabled for amplifying signals on their respective bit lines; and
    timing control means responsive to said determination signal for providing a timing control signal to enable the sense amplifiers designated to be simultaneously enabled, said timing control means including means, responsive to the determination signal designating said second number of sense amplifiers to be simultaneously enabled, for delaying providing said timing control signal as compared to when said determination signal designates said first number of sense amplifiers to be simultaneously enabled.

2. A semiconductor memory device according to claim 1, further comprising sense amplifier activating means responsive to an externally applied state control signal for activating said first number or second number of sense amplifiers, wherein
    said timing control means includes time period control means for controlling a time period of activation of said first number or second number of sense amplifiers by said sense amplifier activating means.

3. A semiconductor memory device according to claim 2, wherein, when the second, greater number of said plurality of sense amplifiers are to be activated simultaneously, said time period control means extends said time period.

4. A semiconductor memory device according to claim 1, further comprising sense amplifier activating means for simultaneously activating said first number or said second number of said plurality of sense amplifiers in response to said determination signal, wherein said sense amplifier activating means includes
    row pre-decoder means for decoding a predetermined bit in an externally applied row address signal, and
    effective bit determining means for determining an effective bit in the row address signal to be decoded by said row pre-decoder means in accordance with said first and second number of said plurality of sense amplifiers to be activated simultaneously.

5. A semiconductor memory device according to claim 4, wherein
    said circuit includes potential fixing means for selectively fixing the potential of an output node of said circuit in accordance with said first and second number of said plurality of sense amplifiers to be activated simultaneously,
    said effective bit determining means includes node potential detecting means for detecting the potential of said output node of said circuit, and
    said row pre-decoder means decodes the effective bit to be decoded in the externally applied row address signal in response to said node potential detecting means.

6. A semiconductor memory device according to claim 5, wherein
    said circuit further includes a bonding pad formed on a semiconductor substrate; and
    said potential fixing means includes
        a grounded input lead, and
        a gold wire for selectively connecting said bonding pad to said grounded input lead in accordance with said first and second number of said plurality of sense amplifiers to be activated simultaneously.

7. A semiconductor memory device according to claim 1, wherein said semiconductor memory device is a dynamic random access memory (DRAM).

8. A semiconductor memory device, comprising:
    a plurality of bit lines;
    a plurality of sense amplifiers connected to respective bit lines;
    a data line for transmitting a data signal provided from said bit lines;
    column decoder means for decoding an externally applied column address signal and providing a column selecting signal;
    a plurality of switching means, each connected between said data line and corresponding ones of said plurality of bit lines, and selectively turned on in response to the column selecting signal from said column decoder means;
    enabling means responsive to an externally applied state control signal for enabling said column decoder means;
    a circuit for providing determination signal designating which of a first number or a second, greater number of sense amplifiers are to be activated simultaneously; and
    enable timing means responsive to said determination signal for providing a timing control signal to said enabling means, said enable timing means including means, responsive to the determination signal designating said second number of sense amplifiers to be activated simultaneously, for delaying providing said timing control signal as compared to when said determination signal designates said first number of sense amplifiers to be activated simultaneously.

9. A semiconductor memory device, comprising:

a plurality of bit lines;

a plurality of sense amplifiers connected to respective bit lines;

a data line for transmitting a data signal provided from said bit lines;

a plurality of switching means, each connected between said data line and corresponding ones of said plurality of bit lines, and selectively rendered conductive by a column decoder means;

a circuit for providing a determination signal designating which of a first number or a second, greater number of sense amplifiers are to be activated simultaneously; and different timing activating means responsive to said determination signal for providing a timing control signal to activate the sense amplifiers designated to be activated simultaneously, said different timing activating means including means, responsive to the determination signal designating said second number of sense amplifiers to be activated simultaneously for delaying providing said timing control signal as compared to when said determination signal designates said first number of sense amplifiers to be activated simultaneously.

* * * * *